(12) United States Patent
Jang et al.

(10) Patent No.: US 8,325,541 B2
(45) Date of Patent: Dec. 4, 2012

(54) NON-VOLATILE SEMICONDUCTOR MEMORY APPARATUS

(75) Inventors: Tae Su Jang, Ichon-si (KR); Sung Joo Hong, Ichon-si (KR); Sung Woong Chung, Ichon-si (KR)

(73) Assignee: SK hynix Inc. (KR)

( * ) Notice: Subject to any disclaimer, the term of this patent is extended or adjusted under 35 U.S.C. 154(b) by 622 days.

(21) Appl. No.: 12/346,646

(22) Filed: Dec. 30, 2008

(65) Prior Publication Data
US 2010/0091579 A1    Apr. 15, 2010

(30) Foreign Application Priority Data
Oct. 15, 2008    (KR) .................. 10-2008-0101006

(51) Int. Cl.
*G11C 7/00* (2006.01)
(52) U.S. Cl. ..................................... 365/189.2
(58) Field of Classification Search ............... 365/189.2
See application file for complete search history.

(56) References Cited

U.S. PATENT DOCUMENTS

| | | | |
|---|---|---|---|
| 5,973,964 A | 10/1999 | Tobita et al. | |
| 2007/0194383 A1* | 8/2007 | Kato | 257/365 |
| 2007/0228489 A1* | 10/2007 | Nakajima et al. | 257/378 |
| 2007/0271409 A1* | 11/2007 | Miura et al. | 711/5 |
| 2008/0266962 A1* | 10/2008 | Jeon et al. | 365/185.12 |
| 2010/0110748 A1* | 5/2010 | Best | 365/51 |

FOREIGN PATENT DOCUMENTS
KR            100801710           1/2008
* cited by examiner

*Primary Examiner* — Hoai V Ho
*Assistant Examiner* — Min Huang
(74) *Attorney, Agent, or Firm* — Baker & McKenzie LLP

(57) ABSTRACT

A non-volatile semiconductor memory apparatus includes a first memory area configured to include a plurality of non-volatile memory cells, a second memory area configured to include a plurality of memory cells whose write speed is faster than the plurality of non-volatile memory cells, and a host interface configured to control the first and second memory areas, wherein the first and second memory areas are configured to be provided with the same address signal and command signal from the host interface.

15 Claims, 3 Drawing Sheets

NON-VOLATILE SEMICONDUCTOR MEMORY APPARATUS

CROSS-REFERENCES TO RELATED PATENT APPLICATION

The present application claims priority under 35 U.S.C 119(a) to Korean Application No. 10-2008-0101006, filed on Oct. 15, 2008, in the Korean Intellectual Property Office, which is incorporated herein by reference in its entirety as if set forth in full.

BACKGROUND

1. Technical Field

The embodiments described herein relate to a semiconductor memory apparatus, and more particularly, to a non-volatile semiconductor memory apparatus.

2. Related Art

Phase change random access memory (PRAM) devices have attracted attention for use as non-volatile memories because of there characteristics of non-volatility and random data access functionality. The PRAM device uses a phase change material whose state is changed to either a crystal state or an amorphous state while the phase change material is cooled down after being heated, thereby storing data. A reversible phase change of a variable resistor (GST) of the PRAM is made by Joule heating through an externally supplied electrical pulse. In particular, in order to write data, an electrical pulse needs to be supplied for a predetermined period of time (for example, 100 ns). Accordingly, since the entire operational speed of the PRAM device is slower than the operational speed of a general dynamic random access memory (DRAM) device, the PRAM device is disadvantageous for high-speed operations.

SUMMARY

A non-volatile semiconductor memory apparatus capable of operating at a high speed is disclosed herein.

In one aspect, a non-volatile semiconductor memory apparatus includes a first memory area configured to include a plurality of non-volatile memory cells, a second memory area configured to include a plurality of memory cells whose write speed is faster than the plurality of non-volatile memory cells, and a host interface configured to control the first and second memory areas, wherein the first and second memory areas are configured to be provided with the same address signal and command signal from the host interface.

In another aspect, a non-volatile semiconductor memory apparatus includes a host interface, and first and second memory areas configured to be controlled by the host interface, wherein data of the first and second memory areas are selectively accessed from the host interface when a read command for the same address is continuously provided after a write command.

In another aspect, a semiconductor memory apparatus includes a semiconductor substrate, a plurality of memory areas on the semiconductor substrate, a first one of the areas containing a group of memory cells having a first write speed different from a write speed of a group of memory cell contained in a second one of the areas, and a host interface configured to control the first and second memory areas, wherein the plurality of areas are each configured to be provided with the same address signal and command signal from the host interface.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
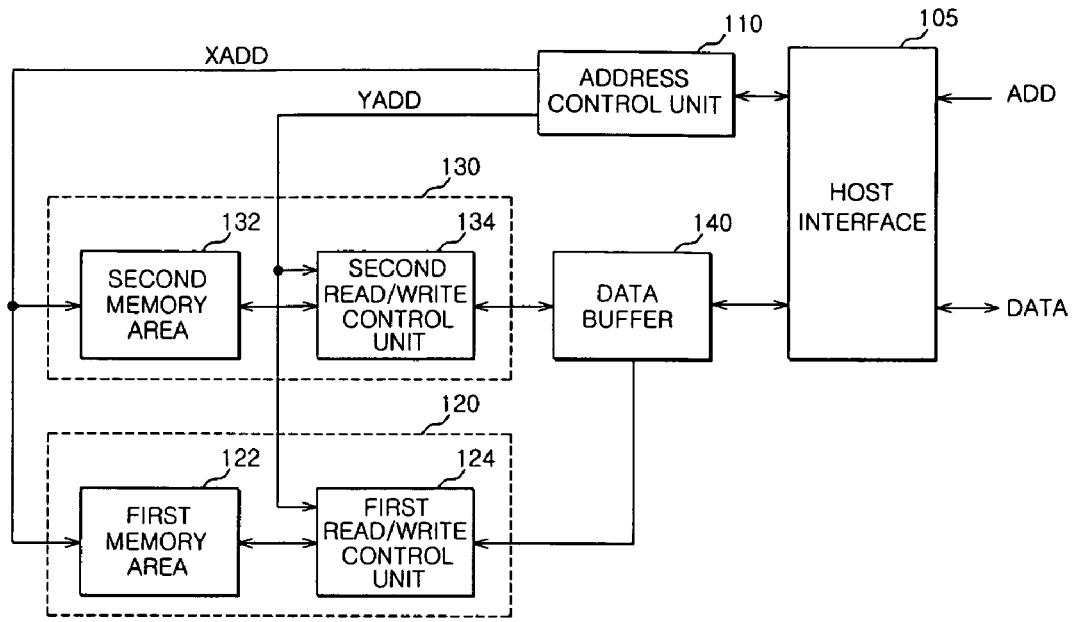
FIG. 1 is a schematic block diagram of an exemplary non-volatile semiconductor memory apparatus according to one embodiment.
Figure 2:
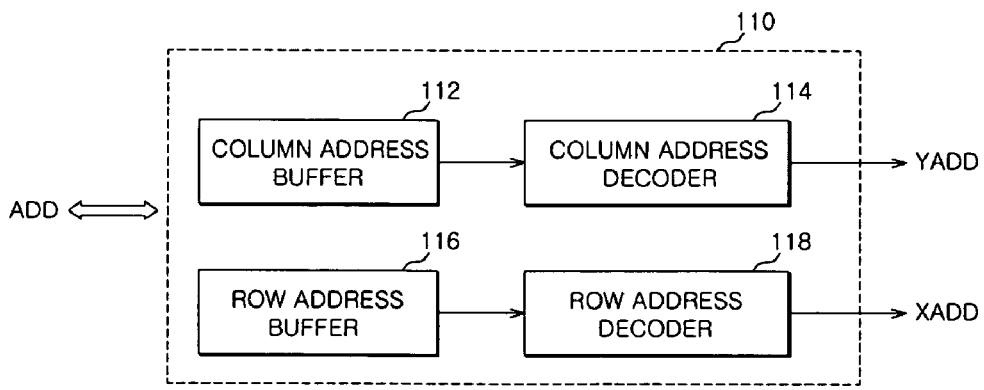
FIG. 2 is a schematic block diagram of an exemplary address control unit capable of being implemented in the apparatus of FIG. 1 according to one embodiment.

FIG. 1 is a schematic block diagram of an exemplary non-volatile semiconductor memory apparatus 100 according to one embodiment, and FIG. 2 is a schematic block diagram of an exemplary address control unit 110 capable of being implemented in the apparatus of FIG. 1 according to one embodiment. In FIGS. 1 and 2, a semiconductor memory apparatus 100 can be configured to include a host interface 105, an address control unit 110, a first memory circuit unit 120, a second memory circuit unit 130, and a data buffer 140.

The host interface 105 can be connected to the address control unit 110 and the data buffer 140. Accordingly, the host interface 105 can transmit and receive an external address signal 'ADD' and data with an external host (not shown), and provide the external address signal 'ADD' and the data to the address control unit 110 and the data buffer 140. When the host interface 105 receives a read command signal that instructs to read data having the same address from the external host (not shown) after receiving a write command signal, the host interface 105 can perform a control operation, wherein the data can be read from the second memory area 132.

The address control unit 110 can receive the external address signal 'ADD' and provide a row address signal 'XADD' and a column address signal 'YADD' to the first and second memory circuit units 120 and 130. For example, the address control unit 110 can be configured to include a column address buffer 112, a column address decoder 114, a row address buffer 116, and a row address decoder 118. Here, the address control unit 110 can receive the external address signal 'ADD' together with an active command signal. For example, the received external address signal 'ADD' can be provided as the row address signal 'XADD' through the row address buffer 116 and the row address decoder 118. In addition, the address control unit 110 can receive the external address signal 'ADD' together with a read or write command signal. Moreover, the received external address signal 'ADD' can be provided as the column address signal 'YADD' through the column address buffer 112 and the column address decoder 114. Here, the operation can be similar to the operation of the common address control unit 110.

In FIG. 1, The first memory circuit unit 120 can be configured to include a first memory area 122 and a first read/write control unit 124.

The first memory area 122 can function as a main memory area and can be configured to include a PRAM cell array as a non-volatile memory. For example, the first memory area 122 can receive the row address signal 'XADD' provided by the address control unit 110.

The first read/write control unit 124 can be driven by receiving the column address signal 'YADD'. Although not shown, the first read/write control unit 124 can be configured to include a sense amplifier to sense and amplify data from the first memory area 122. Further, the first read/write control unit 124 can be configured to include a write driver to write buffered input data into the first memory area 122.

The second memory circuit unit 130 can be configured to include a second memory area 132 and a second read/write control unit 134. For example, the second memory area 132 can function as a sub-memory area and can be configured to include a floating body cell (FBC) that is a volatile memory. Due to operational characteristics of the FBC, the second memory area 132 can operate at a faster speed than a write speed of the first memory area 122. The second memory area 132 can also receive the row address signal 'XADD' provided from the address control unit 110.

Since the FBC of the second memory area 132 can be implemented by a process that is compatible with a process of the PRAM cell of the first memory area 122, it is not difficult to manufacture the FBC. In addition, since the second memory area 132 is a temporary storage area, it is not necessary to secure a memory area having substantially the same size as the first memory area 122.

Since the non-volatile semiconductor memory apparatus 100 can be configured to include the second memory area 132 of which a write speed is faster than that of the first memory area 122, the entire operational speed of the semiconductor memory apparatus 100 can be prevented from becoming limited by the write speed of the first memory area 122. Specifically, when data is written in the first memory area 122, the same row address signal 'XADD' can be provided to the second memory area 132 and a write operation can be completed at a speed that is faster than that of the first memory area 122.

In FIG. 1, the second read/write control unit 134 can sense and amplify data from the second memory area 132, or can write the buffered input data in the second memory area 132.

The data buffer 140 can buffer data between the first and second memory circuit units 120 and 130 and the host interface 105. Although not shown, the data buffer 140 can be configured to include an input buffer or an output buffer.

One embodiment will be described in detail with reference to the following drawings.

Figure 3:
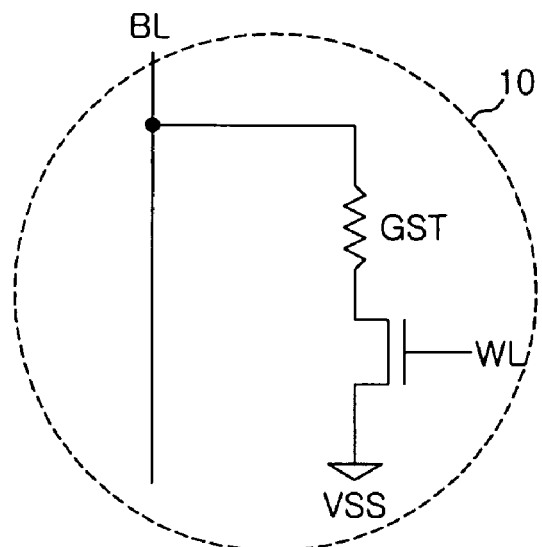
FIG. 3 is an equivalent circuit diagram of a unit cell of an exemplary first memory area capable of being implemented in the apparatus of FIG. 1 according to one embodiment.

FIG. 3 is an equivalent circuit diagram of a unit cell of an exemplary first memory area capable of being implemented in the apparatus of FIG. 1 according to one embodiment. In FIG. 3, a unit cell 10 of the first memory area 122 can be configured to include one cell transistor connected to a word line WL and one variable resistor GST connected to a bit line BL. The variable resistor GST can have a reversible phase change material and can be a specific thin-film material, such as a chalcogenide ($Ge_2Sb_2Te_5$) alloy. The variable resistor GST has an electrical characteristic where specific resistance increases in an amorphous state and decreases in a crystal state. In the PRAM device, data can be stored in a memory cell by setting one of the two physical states using a specific resistance difference of the variable resistor GST.

For example, when the resistance of the variable resistor GST is high, data having a value of —1— can be displayed. Conversely, when the resistance of the variable resistor GST is low, data having a value of —0— can be displayed. Accordingly, digital information can be written.

The reversible phase change of the variable resistor GST of the PRAM device can be made by Joule heating through an externally supplied electrical pulse. The process of controlling a phase of the variable resistor GST in the PRAM device can be called a set/reset process, wherein the phase can be controlled by an electrical pulse.

Specifically, for purposes of explanation, the case where data —0— is written will be described.

A reset pulse that has a narrow pulse width (for example, 60 ns) and a high voltage can be supplied to the variable resistor GST of the PRAM device, wherein the material in a crystal state can be heated and melted at a temperature of a melting point or more. Here, the crystal state can be changed to an amorphous state using a quick cooling phenomenon due to a large temperature difference with an ambient temperature. For example, strong resistance heat is generated by a strong and short electrical pulse, and then the temperature of the material of the variable resistor GST reaches a melting point. As the material is melted and quickly cooled down, the crystal state is changed to the amorphous state where atoms are scattered. As a result, electrical resistance increases.

When data —1— is written now be described. A set pulse that has a relatively long pulse width (for example, 100 ns) and a low voltage can be supplied to the variable resistor GST of the PRAM device, and an amorphous state can be sufficiently heated to a glass transition temperature or more. As a result, the amorphous state can be changed to the crystal state. For example, if a relatively weak and long electrical pulse is supplied to the variable resistor GST in an amorphous state, then the temperature of the material cannot reach a melting point. However, since the material can be heated to a degree to which atoms can be arranged, the amorphous state can be changed to the crystal state. Accordingly, the specific resistance of the variable resistor GST can decrease. Thus, data can be stored by artificially controlling the specific resistance of the variable resistor GST by adjusting voltage and time of the electrical pulse.

When data stored in the memory cell is sensed through a bit line at the time of reading out data, if the variable resistor GST is in a high resistance state, then a level of current that flows through the bit line can be relatively low. Here, if the variable resistor GST is in a low resistance state, then a level of current that flows through the bit line can be relatively high. Accordingly, data —1— or —0— can be read out.

However, in order to cause a phase change in a crystal material, time (60 to 100 ns) that is longer than a write speed (for example, 10 ns) of the DRAM is needed. Thus, it is difficult to perform a high-speed write operation at a write speed that is substantially a write speed of the DRAM device.

Figure 4:
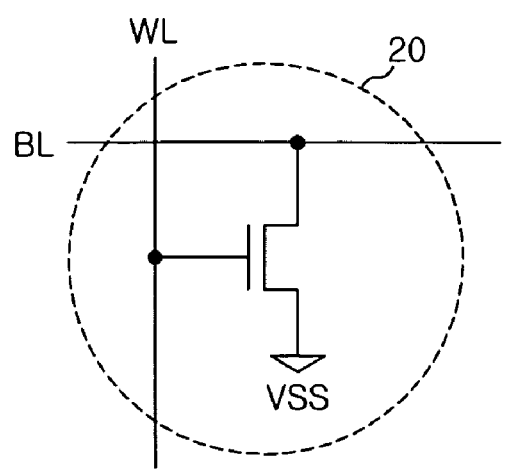
FIG. 4 is an equivalent circuit diagram of a unit cell of an exemplary second memory area capable of being implemented in the apparatus of FIG. 1 according to one embodiment.
Figure 5:
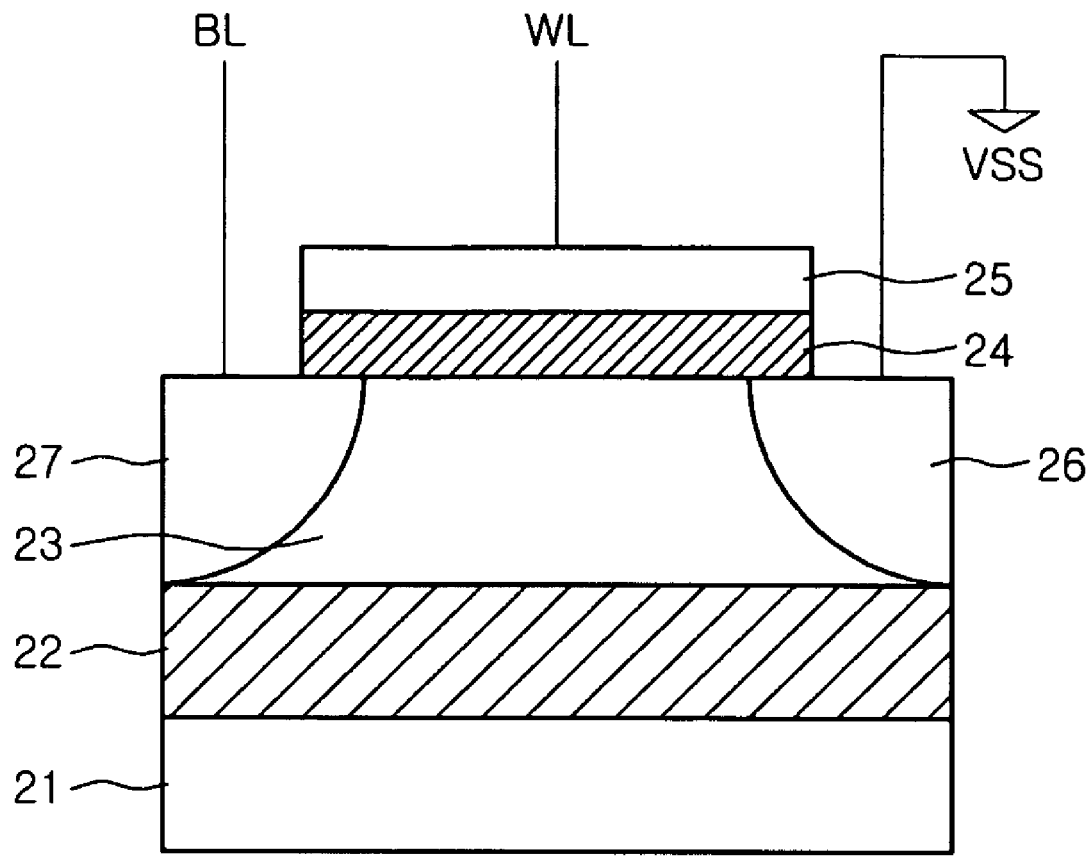
FIG. 5 is a cross-sectional view of a process of a unit cell capable of being implemented in the apparatus of FIG. 1 according to one embodiment.

FIG. 4 is an equivalent circuit diagram of a unit cell of an exemplary second memory area capable of being implemented in the apparatus of FIG. 1 according to one embodiment, and FIG. 5 is a cross-sectional view of a process of a unit cell capable of being implemented in the apparatus of FIG. 1 according to one embodiment. In FIGS. 4 and 5, the unit cell 20 as an FBC can be a 1TR cell that can be implemented by a single transistor without a separate capacitor. Here, for example, the FBC can store a plurality of carriers in a floating body of a transistor. Accordingly, a threshold voltage of the transistor can be changed due to a body effect depending on whether a plurality of carriers are stored or not.

Thus, the changed threshold voltage of the transistor can be represented as a change in the amount of current such that data can be discriminated.

In FIG. 5, the FBC 20 can be configured to include a buried oxide film 22 provided on a semiconductor substrate 21. In addition, a floating body 23, a source area 26, and a drain area 27 can be sequentially disposed on the buried oxide film 22. A gate dielectric film 24 and a gate electrode 25 can be sequentially laminated on the floating body 23. The source area 26 can be connected to a ground GND, the drain area 27 can be connected to the bit line BL, and the gate electrode 25 can be connected to the word line WL. Accordingly, the floating body 23 can be electrically isolated by the buried oxide film 22, the gate dielectric film 24, the source area 26, and the drain area 27. Here, for example, a single transistor floating body DRAM cell can store and read data using a floating body effect.

During a write operation of the single transistor floating body DRAM cell, data —1— can be stored therein. First, the source area 26 is connected to a ground, and a word line program voltage (for example, 1.5 V) of the threshold voltage or more is applied to the gate electrode 25. Then, a bit line program voltage (for example, 1.5 V) is supplied to the drain area 27. As a result, impact ionization can be generated and a large amount of electron-hole pairs can be generated in the floating body 23 near the drain area 27. Among the electron-hole pairs, the electrons enter into the drain area 27, but the holes are accumulated in the floating body 23. As such, a state where the holes are accumulated in the floating body 23 can be assumed as a state where data —1— is stored. The holes that are accumulated in the floating body 23 decrease the threshold voltage.

In the case where data —0— is stored, the source area 26 is connected to a ground, and the word line program voltage (for example, 1.5 V) of the threshold voltage or more is supplied to the gate electrode 25. Next, the bit line program voltage (for example, −1.5 V) that has a low level is supplied to the drain area 27. In this case, the floating body 23 and the drain area 27 are forward biased and the holes that are accumulated in the floating body 23 enter into the drain area 27. Accordingly, since the number of holes in the floating body 23 decreases, it is assumed that data —0— is stored. Since the number of holes in the floating body 23 decreases, the threshold voltage of the transistor increases.

When a read operation is performed on a single transistor floating body DRAM cell, i.e., data is read therefrom, the source area 26 is connected to a ground. In addition, a word line read voltage that is lower than the word line program voltage is supplied to the gate electrode 25, and the bit line read voltage is supplied to the drain area 27. Here, the amount of current that flows between the source area 26 and the drain area 27 changes depending on the amount of holes. For example, data that is stored in the single transistor floating body DRAM cell can be read by detecting the amount of current that flows between the source area 26 and the drain area 27.

In general, since the plurality of holes that are stored in the floating body of the FBC 20 are recombined and lost after a predetermined time passes, the FBC is a volatile memory cell where data can be maintained only when a refresh operation is periodically performed. However, since the second memory area 132 is used as a temporary storage area, a separate refresh operation does not need to be performed.

An exemplary operation of a semiconductor memory apparatus will be described with reference to FIGS. 1-5.

First, when a write command is provided, the same row address signal 'XADD' and column address signal 'YADD' can be provided to the first and second memory circuit units 120 and 130. The write operation can be performed in all of the first and second memory areas 122 and 132. At this time, the write speed of the second memory area 132 can be approximately 10 ns. However, the write speed of the first memory area 122 can be in a range of 60 to 100 ns. Accordingly, the write operation of the second memory area 132 can be first completed before the write operation of the first memory area 122 is completed. Meanwhile, a data retention time of the FBC of the second memory area 132 is generally known as 100 ms. The FBC of the second memory area 132 can hold data until the write operation of the first memory area 122 is completed.

When a read command signal for the corresponding address is continuously provided after a write command signal, an access operation can be performed on data of the second memory area 132 of which the write operation is completed. The data can be read only when the write operation of the data is completed. Accordingly, while the write operation is performed in the first memory area 122, the data of the first memory area 122 cannot be read.

While the write operation is performed in the first memory area 122, the write operation of the second memory area 132 is already completed. Accordingly, the host interface 105 can have access to the second memory area 132 as a volatile memory and provide read data to the external host (not shown). For example, the semiconductor memory apparatus 100 can use a PRAM device as a main memory, but can operate the PRAM device at a high speed like the write speed of the second memory area 132 using the FBC.

Since the second memory area 132 is a volatile memory, data is volatilized after a predetermined data detention time passes. However, all data can be stored in a non-volatile memory area that corresponds to the first memory area 122. The second memory area 132 is only a temporary storage area to compensate for a write speed according to the read command input immediately after the write command. Thus, a separate refresh operation needed to store data can be omitted.

As such, the write operation can be performed in the PRAM cell area as the main memory area and the FBC area as the sub-memory area. Thus, with respect to the continuously provided 'read command after a write command', data that is written in the FBC area at a high speed can be read, thereby enabling a fast response.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A non-volatile semiconductor memory apparatus, comprising:
   a first memory area configured to include a plurality of non-volatile memory cells;
   a second memory area configured to include a plurality of memory cells whose write speed is faster than the plurality of non-volatile memory cells; and
   a host interface configured to control the first and second memory areas, wherein
   the first memory area and the second memory area start a write operation at the same time in response to a write command and write address, and the host interface is configured to access the second memory in response to a read command and a read address that is the same address as the write address before completion of the write operation for the first memory area.

2. The non-volatile semiconductor memory apparatus of claim 1, wherein the first memory area is configured to include a plurality of phase change memory cells.

3. The non-volatile semiconductor memory apparatus of claim 1, wherein the second memory area is configured to include a plurality of volatile floating body cells.

4. A non-volatile semiconductor memory apparatus, comprising:
a host interface; and
first and second memory areas configured to be controlled by the host interface, wherein
the first memory area and the second memory area start a write operation at the same time in response to a write command and write address, and
the host interface is configured to access the second memory in response to a read command and a read address that is the same address as the write address before completion of the write operation for the first memory area.

5. The non-volatile semiconductor memory apparatus of claim 4, wherein the first and second memory areas are configured to be supplied with a same address signal and command signal from the host interface.

6. The non-volatile semiconductor memory apparatus of claim 4, wherein the first memory area is configured to be a non-volatile memory area and the second memory area is configured to be a volatile memory area.

7. The non-volatile semiconductor memory apparatus of claim 6, wherein a data retention time of the second memory area is equal to a write time of the first memory area or more.

8. The non-volatile semiconductor memory apparatus of claim 7, wherein the first memory area is configured to include a plurality of phase change memory cells.

9. The non-volatile semiconductor memory apparatus of claim 7, wherein the second memory area is configured to include a plurality of floating body cells.

10. The non-volatile semiconductor memory apparatus of claim 9, wherein the second memory area is configured such that a separate refresh operation is not performed.

11. A semiconductor memory apparatus, comprising:
a semiconductor substrate;
a plurality of memory areas on the semiconductor substrate, a first one of the areas containing a group of memory cells having a first write speed different from a write speed of a group of memory cells contained in a second one of the areas; and
a host interface configured to control the first and second memory areas, wherein
the first one of the areas and the second one of the areas start a write operation at the same time in response to a write command and write address, and
the host interface is configured to access the second one of the areas in response to a read command and a read address that is the same address as the write address before completion of the write operation for the first one of the areas.

12. The semiconductor memory apparatus of claim 11, wherein the first one of the areas includes a plurality of phase change memory cells, and the second one of areas includes a plurality of volatile floating body cells.

13. The semiconductor memory apparatus of claim 11, wherein the second one of the areas excludes a separate refresh operation.

14. The non-volatile semiconductor memory apparatus of claim 1, wherein the first and second memory areas are configured to be provided with a same address signal and command signal from the host interface.

15. The non-volatile semiconductor memory apparatus of claim 11, wherein the first one of the areas and the second one of the areas are configured to be provided with a same address signal and command signal from the host interface.

* * * * *